US010672907B2

(12) United States Patent
Chowdhury et al.

(10) Patent No.: US 10,672,907 B2
(45) Date of Patent: Jun. 2, 2020

(54) CHANNEL REGION DOPANT CONTROL IN FIN FIELD EFFECT TRANSISTOR

(71) Applicant: International Business Machines Corporation, Armonk, NY (US)

(72) Inventors: Murshed M. Chowdhury, Schenectady, NY (US); Brian J. Greene, Wappingers Falls, NY (US); Arvind Kumar, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 653 days.

(21) Appl. No.: 14/880,441

(22) Filed: Oct. 12, 2015

(65) Prior Publication Data

US 2016/0035831 A1    Feb. 4, 2016

Related U.S. Application Data

(62) Division of application No. 14/260,953, filed on Apr. 24, 2014, now Pat. No. 9,379,185.

(51) Int. Cl.
*H01L 29/78* (2006.01)
*H01L 21/324* (2006.01)
(Continued)

(52) U.S. Cl.
CPC .......... *H01L 29/785* (2013.01); *H01L 21/223* (2013.01); *H01L 21/26506* (2013.01);
(Continued)

(58) Field of Classification Search
CPC ......... H01L 29/41783; H01L 29/41791; H01L 29/66795; H01L 29/7851; H01L 21/223
See application file for complete search history.

(56) References Cited

U.S. PATENT DOCUMENTS

| 8,021,949 B2 | 9/2011 | Cheng et al. |
| 8,148,217 B2 | 4/2012 | Izumida et al. |

(Continued)

FOREIGN PATENT DOCUMENTS

| WO | 96/26910 A1 | 9/1996 |
| WO | 2011/029010 A2 | 3/2011 |

OTHER PUBLICATIONS

Sivasankaran, K. et al., "Impact of Device Geometry and Doping Concentration Variation on Electrical Characteristics of 22nm FinFET" 2013 IEEE International Conference on Emerging Trends in Computing, Communication and Nanotechnology (ICECCN 2013) (Mar. 25-26, 2013) pp. 528-531.

(Continued)

*Primary Examiner* — Marcos D. Pizarro
(74) *Attorney, Agent, or Firm* — Scully, Scott, Murphy & Presser, P.C.; Alvin Borromeo, Esq.

(57) ABSTRACT

A dummy gate structure straddling at least one semiconductor fin is formed on a substrate. Active semiconductor regions and raised active semiconductor regions may be formed. A planarization dielectric layer is formed over the at least one semiconductor fin, and the dummy gate structure is removed to provide a gate cavity. Electrical dopants in the channel region can be removed by outgassing during an anneal, thereby lowering the concentration of the electrical dopants in the channel region. Alternately or additionally, carbon can be implanted into the channel region to deactivate remaining electrical dopants in the channel region. The threshold voltage of the field effect transistor can be effectively controlled by the reduction of active electrical dopants in the channel region. A replacement gate electrode can be subsequently formed in the gate cavity.

20 Claims, 11 Drawing Sheets

(51) Int. Cl.
*H01L 29/417* (2006.01)
*H01L 21/223* (2006.01)
*H01L 21/322* (2006.01)
*H01L 29/66* (2006.01)
*H01L 21/265* (2006.01)

(52) U.S. Cl.
CPC ........ *H01L 21/324* (2013.01); *H01L 21/3221* (2013.01); *H01L 29/41783* (2013.01); *H01L 29/41791* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 8,258,585 B2 | 9/2012 | Sasaki et al. |
| 2005/0118770 A1* | 6/2005 | Nandakumar ...... H01L 21/3003 438/305 |
| 2006/0068556 A1* | 3/2006 | Noda ................. H01L 21/2253 438/305 |
| 2008/0237719 A1 | 10/2008 | Doyle et al. |
| 2009/0221117 A1 | 9/2009 | Tan et al. |
| 2012/0049293 A1* | 3/2012 | Scheiper ........... H01L 21/26506 257/392 |
| 2012/0238074 A1 | 9/2012 | Santhanam et al. |
| 2013/0105894 A1 | 5/2013 | Brodsky et al. |
| 2013/0221447 A1* | 8/2013 | Lee ....................... H01L 27/092 257/369 |
| 2013/0221491 A1 | 8/2013 | Wann et al. |
| 2013/0280883 A1 | 10/2013 | Faul et al. |
| 2015/0024561 A1* | 1/2015 | Li ..................... H01L 21/28123 438/222 |
| 2015/0270401 A1 | 9/2015 | Huang et al. |
| 2018/0047846 A1* | 2/2018 | Brask ................. H01L 29/7848 |

OTHER PUBLICATIONS

Murarka, S.P., "Phophorus out-diffusion during high temperature anneal of phoshorus-doped polycrystalline silicon and SiO2" Journal of Applied Physics (1984).

Tabe, M. et al., "Segregation and desorption kinetics for evaporation of arsenic from silicon" Journal of Applied Physics (1979) 5292-5295, vol. 50, No. 8.

Zhong, L. et al., "Outdiffusion of impurity atoms from silicon crystals and its dependence upon the annealing atmosphere" Applied Physics Letters (1996) pp. 1229-1231, vol. 68, No. 9.

Suzuki, K. et al., "Boron out diffusion from Si substrates in various ambients" Solid-State Electronics (Aug. 1997) pp. 1095-1097, vol. 41, No. 8.

List of IBM Patents or Patent Applications Treated As Related filed on Nov. 19, 2015, 2 pages.

* cited by examiner

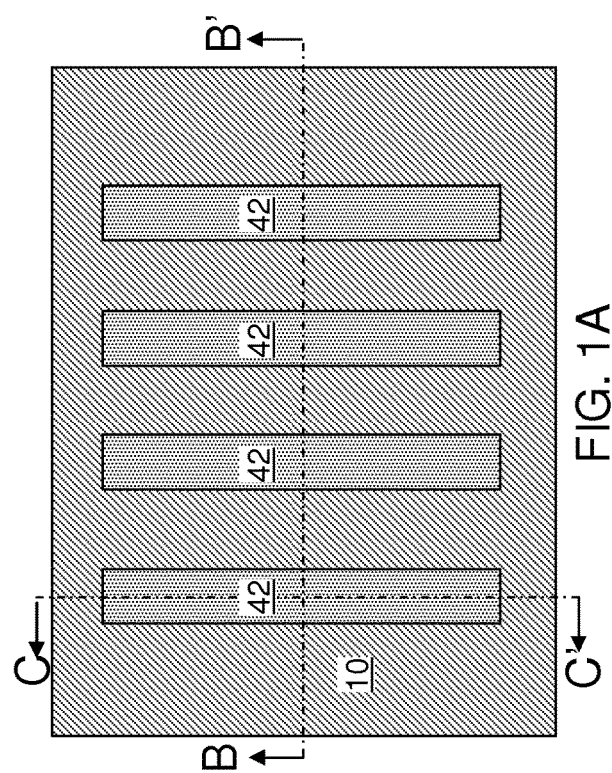
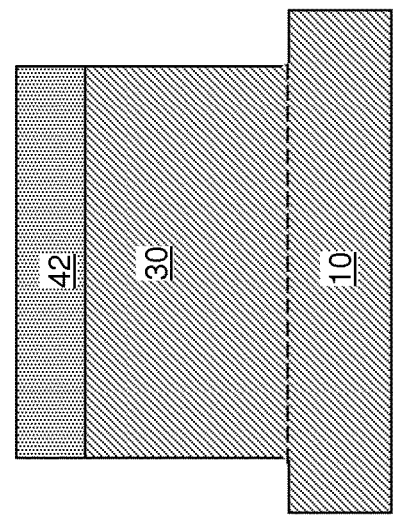
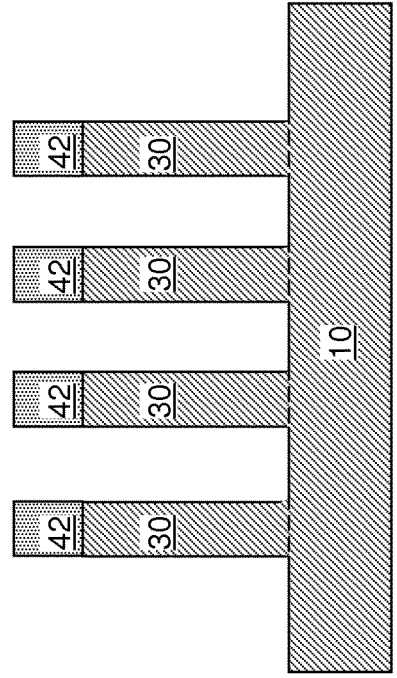
FIG. 1A
FIG. 1B
FIG. 1C

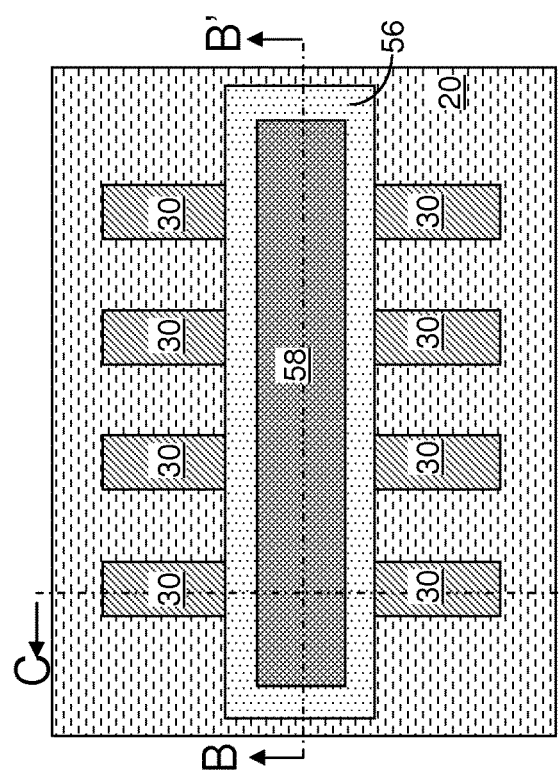
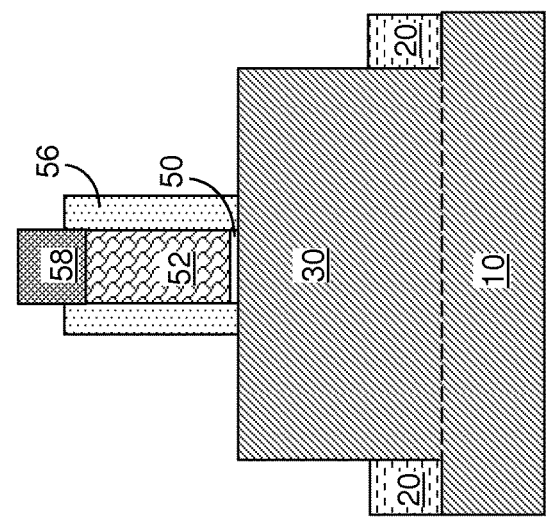
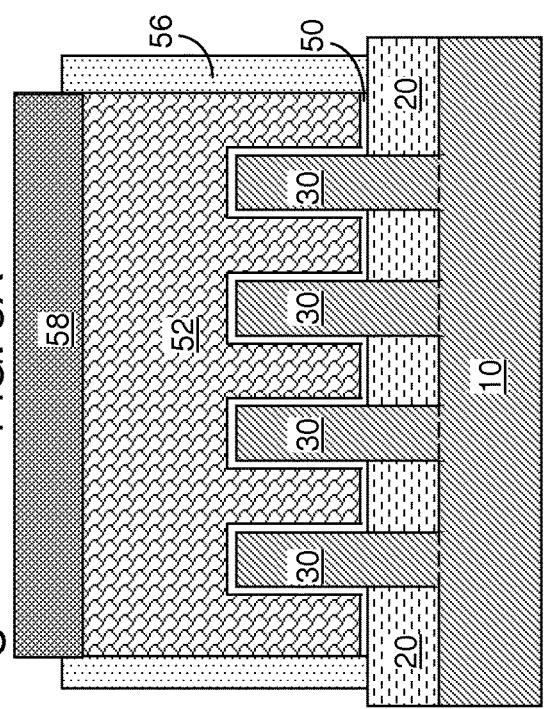
FIG. 3A
FIG. 3B
FIG. 3C

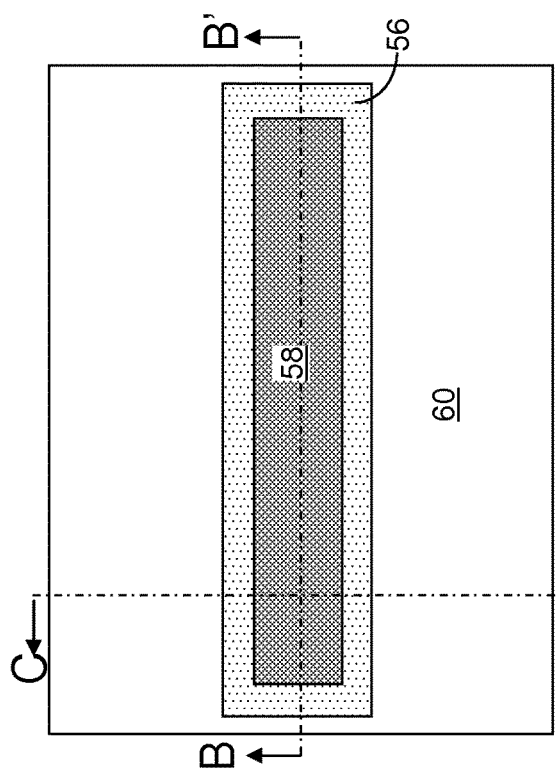
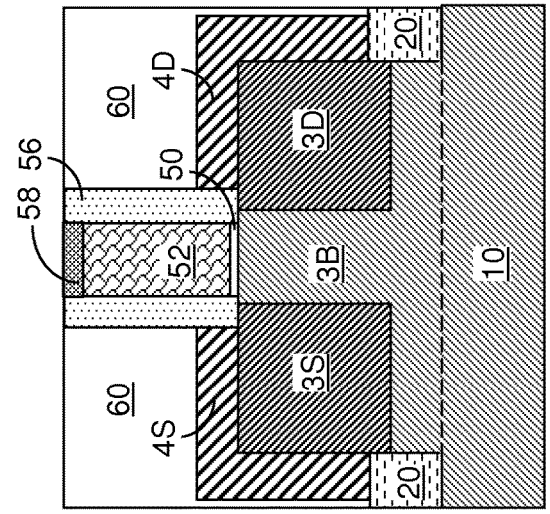
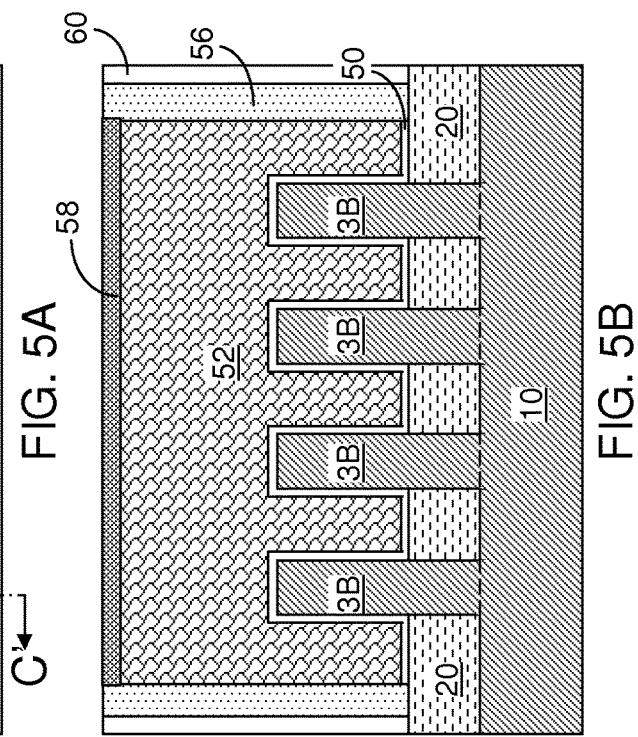
FIG. 5A
FIG. 5B
FIG. 5C

CHANNEL REGION DOPANT CONTROL IN FIN FIELD EFFECT TRANSISTOR

BACKGROUND

The present disclosure relates to a semiconductor structure, and particularly to a semiconductor structure including a channel region of a field effect transistor having a controlled dopant profile and a method for manufacturing the same.

The threshold voltage and the short channel effect in field effect transistors having a nanoscale channel is, in part, determined by the dopant profile in the channel region. Precise alignment of the dopant profile with a gate electrode is essential in the manufacture of field effect transistors with well-defined device characteristics such as the threshold voltage and the short channel effects of the field effect transistors. A method is thus desired for controlling the dopant profile in the channel region of a field effect transistor with self-alignment to a source region, a drain region, and an overlying gate electrode.

SUMMARY

A dummy gate structure straddling at least one semiconductor fin is formed on a substrate. Active semiconductor regions and raised active semiconductor regions may be formed. A planarization dielectric layer is formed over the at least one semiconductor fin, and the dummy gate structure is removed to provide a gate cavity. Electrical dopants in the channel region can be removed by outgas sing during an anneal, thereby lowering the concentration of the electrical dopants in the channel region. Alternately or additionally, carbon can be implanted into the channel region to deactivate remaining electrical dopants in the channel region. The threshold voltage of the field effect transistor can be effectively controlled by the reduction of active electrical dopants in the channel region. A replacement gate electrode can be subsequently formed in the gate cavity.

According to an aspect of the present disclosure, a method of forming a semiconductor structure is provided. A semiconductor fin is formed on a substrate. The semiconductor fin includes atoms of an electrical dopant of a conductivity type throughout an entirety thereof. The conductivity type is selected from p-type and n-type. A planarization dielectric layer is formed over the at least one semiconductor fin. A cavity straddling the semiconductor fin is formed in the planarization dielectric layer. A subset of the atoms of the electrical dopant is formed from a portion of the semiconductor fin underlying the cavity and physically exposed to an ambient in an anneal process.

According to another aspect of the present disclosure, a semiconductor structure is provided, which contains a semiconductor fin located on a substrate and including a source region, a drain region, and a body region. Each of the source region and the drain region includes a uniformly doped portion including atoms of a first electrical dopant of a first conductivity type at a first concentration and a second electrical dopant of a second conductivity type at a second concentration that is greater than the first concentration. The second conductivity type is the opposite of the first conductivity type. The body region includes another uniformly doped portion including atoms of the first electrical dopant at a third concentration that is less than the first concentration. The semiconductor structure further contains a gate stack including a gate dielectric and a gate electrode and straddling the body region.

BRIEF DESCRIPTION OF SEVERAL VIEWS OF THE DRAWINGS

FIG. 1A is a top-down view of an exemplary semiconductor structure after formation of semiconductor fins according to an embodiment of the present disclosure.

FIG. 1B is a vertical cross-sectional view of the exemplary structure along the vertical plane B-B' in FIG. 1A.

FIG. 1C is a vertical cross-sectional view of the exemplary structure along the vertical plane C-C' in FIG. 1A.

FIG. 3A is a top-down view of the exemplary semiconductor structure after formation of a disposable gate structure and a gate spacer according to an embodiment of the present disclosure.

FIG. 3B is a vertical cross-sectional view of the exemplary structure along the vertical plane B-B' in FIG. 3A.

FIG. 3C is a vertical cross-sectional view of the exemplary structure along the vertical plane C-C' in FIG. 3A.

FIG. 5A is a top-down view of the exemplary semiconductor structure after deposition and planarization of a planarization dielectric layer according to an embodiment of the present disclosure.

FIG. 5B is a vertical cross-sectional view of the exemplary structure along the vertical plane B-B' in FIG. 5A.

FIG. 5C is a vertical cross-sectional view of the exemplary structure along the vertical plane C-C' in FIG. 5A.

DETAILED DESCRIPTION

Figure 2C:
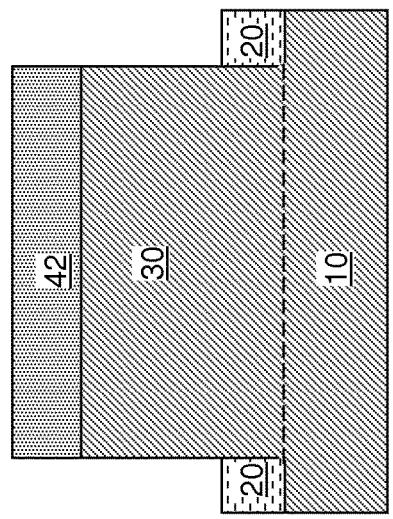
FIG. 2C is a vertical cross-sectional view of the exemplary structure along the vertical plane C-C' in FIG. 2A.

As stated above, the present disclosure relates to a semiconductor structure including a channel region of a field effect transistor having a controlled dopant profile and a method for manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A-1C, an exemplary semiconductor structure according to an embodiment of the present disclosure can be formed by providing a semiconductor substrate, which can be a bulk semiconductor substrate or a semiconductor-on-insulator (SOI) substrate. At least an upper portion of the semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

The upper portion of the semiconductor substrate can be patterned, by a combination of lithographic methods and an anisotropic etch, to form at least one semiconductor region, i.e., a region including a semiconductor material. The at least one semiconductor region can be at least one semiconductor fin 30. In one embodiment, the at least one semiconductor region can be at least one doped semiconductor region. In one embodiment, the at least one semiconductor fin 30 can be formed by patterning a top semiconductor layer of a semiconductor-on-insulator (SOI) substrate including the top semiconductor layer, a buried insulator layer, and a handle substrate. A stack of the buried insulator layer and the handle substrate collectively constitute a substrate on which the at least one semiconductor fin 30 is present. In another embodiment, the at least one semiconductor fin 30 can be formed by patterning an upper portion of a bulk semiconductor substrate. The remaining unpatterned portion of the bulk semiconductor substrate that underlies the at least one semiconductor fin is a semiconductor material layer 10, which constitutes a substrate mechanically supporting the at least one semiconductor fin 30.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

For example, a photoresist layer (not shown) can be applied over the top surface of the semiconductor substrate and lithographically patterned to mask portions of the semiconductor substrate in which the at least one semiconductor fin 30 is subsequently formed. Optionally, a dielectric material layer may be provided between the semiconductor substrate and the photoresist layer. The pattern in the photoresist layer can be transferred through the dielectric material layer, if present, and into the upper portion of the semiconductor substrate. The at least one remaining patterned portion of the semiconductor substrate constitutes the at least one semiconductor fin 30. If the dielectric material layer is present between the semiconductor substrate and the patterned photoresist layer, each remaining portion of the dielectric material layer constitutes a dielectric fin cap 42, which has the same horizontal cross-sectional shape as the underlying semiconductor fin 30.

If the semiconductor substrate is a bulk substrate, the remaining portion of the semiconductor substrate underlying the at least one semiconductor fin 30 is the semiconductor material layer 10. In this case, the semiconductor material layer 10 is a substrate on which the at least one semiconductor fin 30 is formed. The semiconductor material layer 10 functions as a substrate mechanically supporting the at least one semiconductor fin 30. The at least one semiconductor fin 30 and the semiconductor material layer 10 collectively constitute a contiguous semiconductor material portion. In one embodiment, the entirety of the contiguous semiconductor material portion can be single crystalline. Alternatively, if the semiconductor substrate is a semiconductor-on-insulator (SOI) substrate, a vertical stack of a buried insulator layer and a handle substrate layer can be present underneath the at least one semiconductor fin 30 in lieu of the semiconductor material layer 10. In this case, the vertical stack of the buried insulator layer and the handle substrate layer is a substrate on which the at least one semiconductor fin 30 is formed.

The height of each semiconductor fin 30 can be from 5 nm to 1,000 nm, although lesser and greater heights can also be employed. The at least one semiconductor fin 30 and the semiconductor material layer 10 can be doped with electrical dopants, i.e., p-type dopants or n-type dopants. As used herein, an electrical dopant refers to a dopant that introduces an extra charge to the band structure of the semiconductor material into which the electrical dopant is introduced. The at least one semiconductor fin 30 and the semiconductor material layer 10 can have a same type of doping, which is herein referred to as a first conductivity type. In one embodiment, the at least one semiconductor fin 30 can be formed by patterning a semiconductor material layer including atoms of the electrical dopant of the first conductivity type at a uniform concentration (which is herein referred to as a first concentration) throughout the entirety thereof.

In one embodiment, the entirety of the at least one semiconductor fin 30 and the semiconductor material layer 10 can have a uniform doping of the first conductivity type. As used herein, a "uniform doping" refers to a doping having a same dopant concentration throughout as measured employing methods of dopant concentration measurement as known in the art. It is understood that the measurement of dopant concentration takes averages on atomic scale dopant concentration variations that are statistically present in any doped material. In one embodiment, the entirety of the semiconductor material layer that is patterned into the at least one semiconductor fin 30, i.e., the entirety of a top semiconductor layer of an SOI substrate or an upper semiconductor portion of a bulk semiconductor substrate), can have a doping of a first electrical dopant of the first conductivity type at a first atomic concentration. In one embodiment, at least an upper portion of a bulk substrate from which the at least one semiconductor fin 30 is patterned can have a doping of a first electrical dopant of the first conductivity type at a first atomic concentration. In one embodiment, an entirety of a bulk substrate as provided can have a doping of a first electrical dopant of the first conductivity type at a first atomic concentration.

The first atomic concentration can be in a range from $1.0 \times 10^{15}/cm^3$ to $1.0 \times 10^{19}/cm^3$. In another embodiment, the first atomic concentration can be in a range from $1.0 \times 10^{16}/cm^3$ to $1.0 \times 10^{17}/cm^3$. In yet another embodiment, the first atomic concentration can be in a range from $1.0 \times 10^{17}/cm^3$ to $1.0 \times 10^{18}/cm^3$. In still another embodiment, the first atomic concentration can be in a range from $1.0 \times 10^{18}/cm^3$ to $1.0 \times 10^{19}/cm^3$.

Each semiconductor fin 30 is laterally bound by a pair of lengthwise sidewalls and a pair of widthwise sidewalls. As used herein, a "lengthwise direction" of an element refers to a direction that is parallel to the axis which passes through the center of mass of the element and about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the at least one semiconductor fin 30 can have a rectangular horizontal cross-sectional shape.

In one embodiment, lengthwise sidewalls of a semiconductor fin 30 can be within a pair of vertical planes laterally spaced from each other by the width of the semiconductor fin 30. In one embodiment, the at least one semiconductor fin 30 can be within a plurality of semiconductor fins laterally spaced from one another along the widthwise direction of the semiconductor fins 30.

Figure 2A:
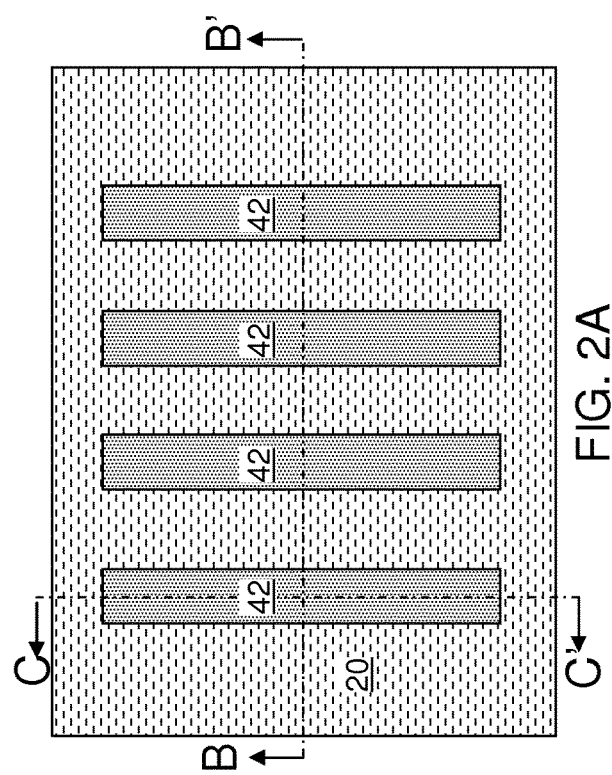
FIG. 2A is a top-down view of the exemplary semiconductor structure after formation of a shallow trench isolation layer according to an embodiment of the present disclosure.
Figure 2B:
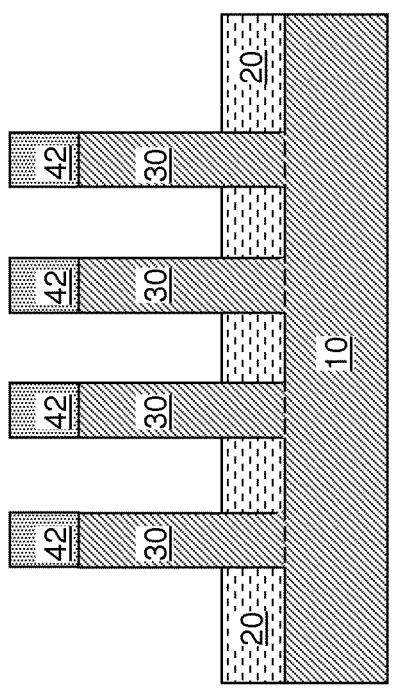
FIG. 2B is a vertical cross-sectional view of the exemplary structure along the vertical plane B-B' in FIG. 2A.

Referring to FIGS. 2A-2C, a shallow trench isolation layer 20 can be formed around bottom portions of the at least one semiconductor fin 30. The shallow trench isolation layer 20 includes a dielectric material such as silicon oxide. The shallow trench isolation layer 20 can be formed by depositing a self-planarizing dielectric material over the semiconductor material layer 10 and around the bottom portion of each semiconductor fin 30. The deposition of the dielectric material can be performed, for example, by chemical vapor deposition or a self-planarizing deposition process such as spin coating. If the deposition process is not self-planarizing, excess portions of the deposited dielectric material can be removed from above the top surfaces of the at least one semiconductor fin 30, for example, by planarization (such as chemical mechanical planarization (CMP)). The shallow trench isolation layer 20 laterally surrounds the at least one semiconductor fin 30. The top surface of the shallow trench isolation layer 20 is recessed with respect to the top surfaces of the at least one semiconductor fin 30.

Doped wells (not shown) may be formed in an upper portion of the semiconductor material layer 10 and underneath at least one semiconductor fin 30 as needed. Optionally, a punchthrough doping layer (not shown) having a doping of the opposite conductivity type as the at least one semiconductor fin 30 may be provided at portions of the semiconductor material layer 10 that underlies the at least one semiconductor fin 30. In general, various portions of the semiconductor material layer 10 can be doped to provide suitable electrical isolation among the at least one semiconductor fin 30.

Referring to FIGS. 3A-3C, a disposable gate structure (50, 52, 58) can be formed across the at least one semiconductor fin 30. The disposable gate structure (50, 52, 58) can be a disposable gate structure that includes at least one disposable material, i.e., at least one material that are subsequently removed. For example, the disposable gate structure (50, 52, 58) can include a lower disposable gate material portion 50 including a first dielectric material, a middle disposable gate material portion 52 including a disposable semiconductor material, and an upper disposable gate material portion 58 including a second disposable dielectric material. In an illustrative example, the lower disposable gate material portions 50 can include silicon oxide, the middle disposable gate material portions 52 can include germanium or a germanium-containing alloy that can be removed selective to the semiconductor materials of the at least one semiconductor fin 30, and the upper disposable gate material portion 58 can include silicon nitride. The disposable gate structure (50, 52, 58) can be formed by deposition of disposable material layers, application and lithographic patterning of a photoresist layer above the disposable material layers, and transfer of the pattern in the patterned photoresist layer through the disposable material layers by an anisotropic etch such as a reactive ion etch. The remaining portions of the disposable material layers constitute the disposable gate structure (50, 52, 58). The patterned photoresist layer can be removed, for example, by ashing.

A gate spacer 56 can be formed by depositing a gate spacer layer and anisotropically etching the gate spacer layer. The gate spacer layer can be formed on the top surfaces and sidewalls of the gate structures (50, 52, 58) and the at least one semiconductor fin 30 by a conformal deposition of a dielectric material. The gate spacer layer can be formed, for example, by low pressure chemical vapor deposition (LPCVD), atomic layer deposition (ALD), or any other conformal deposition method for depositing a dielectric material as known in the art. In one embodiment, the gate spacer layer can include silicon nitride. The dielectric material of the gate spacer layer can be silicon oxide, silicon nitride, silicon oxynitride, organosilicate glass, a dielectric metal oxide, a dielectric metal nitride, or a combination thereof. The thickness of the gate spacer layer can be in a range from 3 nm to 60 nm, although lesser and greater thicknesses can also be employed.

An anisotropic etch is performed to remove horizontal portions of the gate spacer layer. The anisotropic etch can be selective to the semiconductor material of the at least one semiconductor fin 30. The anisotropic etch is extended further after removal of horizontal portions of the gate spacer layer so that all vertical portions of the gate spacer layer are removed from the sidewalls of the at least one semiconductor fin 30. Remaining vertical portions of the gate spacer layer located on the gate structure (50, 52, 58) constitute the gate spacer 56.

Figure 4A:
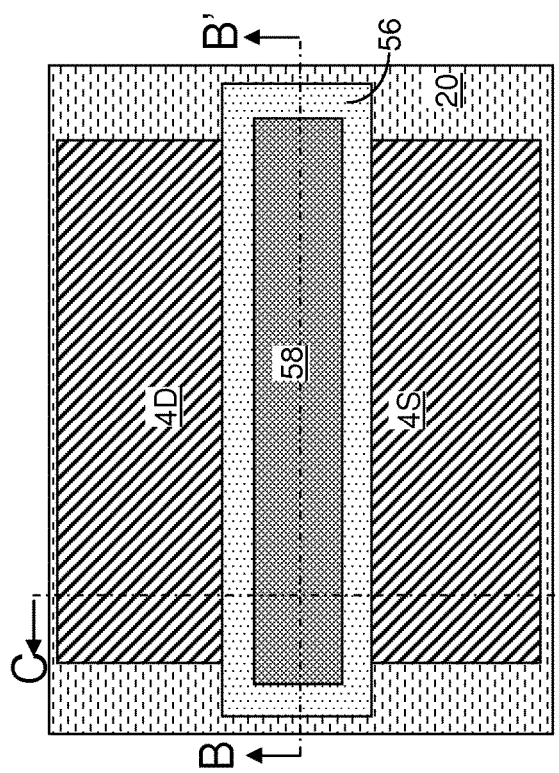
FIG. 4A is a top-down view of the exemplary semiconductor structure after formation of raised active regions and fin active regions according to an embodiment of the present disclosure.
Figure 4B:
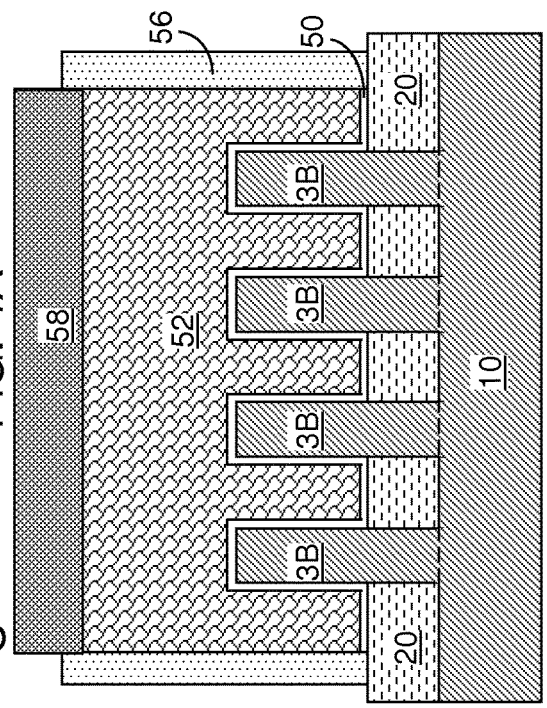
FIG. 4B is a vertical cross-sectional view of the exemplary structure along the vertical plane B-B' in FIG. 4A.
Figure 4C:
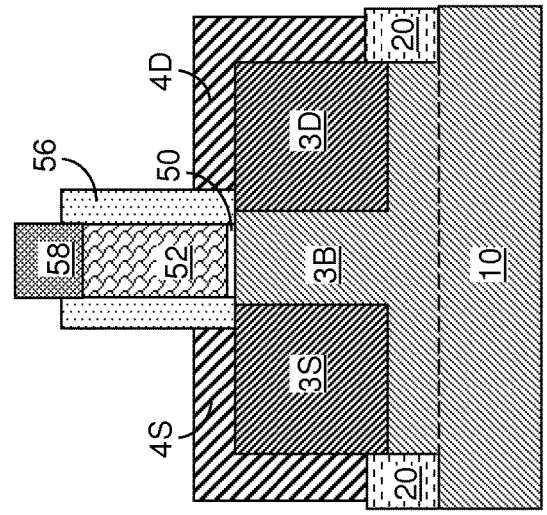
FIG. 4C is a vertical cross-sectional view of the exemplary structure along the vertical plane C-C' in FIG. 4A.

Referring to FIGS. 4A-4C, raised active regions (4S, 4D) are formed on physically exposed semiconductor surfaces of the at least one semiconductor fin 30 by selective deposition of a semiconductor material. The raised active regions (4S, 4D) can include at least one raised source region 4S and at least one raised drain region 4D. In one embodiment, the selective deposition of the semiconductor material can be performed by a selective epitaxy process. During the selective epitaxy process, the deposited semiconductor material grows from physically exposed semiconductor surfaces, i.e., the physically exposed portions of the lengthwise sidewalls and top surfaces of the at least one semiconductor fin 30, while the semiconductor material is not deposited on, and thus, does not grow from, dielectric surfaces such as the outer sidewalls of the gate spacer 56, the topmost surface of the gate stack (50, 52, 58), and the top surface of the shallow trench isolation layer 20.

As used herein, a "raised active region" refers to an active region (i.e., a source region or a drain region) that is located on, and outside, a semiconductor fin or a preexisting semiconductor material portion. In one embodiment, each portion of the raised active regions (4S, 4D) can be epitaxially aligned to an underlying semiconductor fin 30. The raised active regions (4S, 4D) can include the same semiconductor material as, or a semiconductor material different from, the semiconductor material of the at least one semiconductor fin 30.

The growth of the raised active regions (4S, 4D) can proceed with, or without, crystallographically faceted surfaces depending on the deposited semiconductor material and the deposition conditions. In one embodiment, the various semiconductor material portions of the raised active regions (4S, 4D) can be formed with crystallographic facets. The crystallographic facets of the raised active regions (4S, 4D) can be at a non-zero, non-orthogonal, angle with respect to adjoining surfaces of the raised active regions (4S, 4D).

In one embodiment, the at least one semiconductor fin 30 can include a plurality of semiconductor fins and the selective epitaxy process can proceed until multiple raised active regions (4S, 4D) from neighboring semiconductor fins 30 merge. Within each merged raised active region (4S or 4D), grain boundaries can be formed at the interface at which neighboring single crystalline semiconductor material portions contact each other. The selective epitaxy process can be terminated when the sizes of the raised active regions (4S, 4D) reach a predetermined target, for example, by controlling the deposition conditions and the deposition time.

The raised active regions (4S, 4D) are doped with atoms of electrical dopants of a second conductivity type that is the opposite of the first conductivity type. The second conductivity type is the opposite of the first conductivity type. For example, if the first conductivity type is p-type, the second conductivity type is n-type, and vice versa. The doping of the raised active regions (4S, 4D) can be performed during, or after, formation of the raised active regions (4S, 4D). Atoms of the electrical dopant having the second conductivity type are introduced into the raised source region 4S and the raised drain region 4D at a greater concentration than the first concentration, i.e., the atomic concentration of the electrical dopants of the first conductivity type within the at least one semiconductor fin 30 as provided prior to formation of the raised source and drain regions (4S, 4D).

In one embodiment, the raised active regions (4S, 4D) can be formed with in-situ doping of atoms of electrical dopants of the second conductivity type during the selective epitaxy process. Thus, each portion of the raised active regions (4S, 4D) can be formed as doped semiconductor material portions. Alternatively, the raised active regions (4S, 4D) can be formed by ex-situ doping. In this case, the raised active regions (4S, 4D) can be formed as intrinsic semiconductor material portions and electrical dopants can be subsequently introduced into the raised active regions (4S, 4D) to convert the raised active regions (4S, 4D) into doped semiconductor material portions.

If in-situ doping is employed, an anneal process can be performed to outdiffuse the electrical dopants from the raised active regions (4S, 4D) into underlying portions of the at least one semiconductor fin 30 to form fin active regions (3S, 3D). In this case, the diffused atoms of the electrical dopant of the second conductivity type are present in each fin active region (3S, 3D) at a greater concentration than the first concentration, which is the concentration, prior to the anneal process, of the atoms of the electrical dopant of the first conductivity type in the semiconductor fin 30. In one embodiment, the atoms of the electrical dopants of the first conductivity type can be present at the same concentration, i.e., the first concentration, throughout the entirety of each semiconductor fin 30 prior to the anneal process and throughout the entirety of each semiconductor fin (3S, 3D, 3B) after the anneal process.

It is understood that the anneal process can be performed at a subsequent processing step instead of performing the anneal process immediately after formation of the raised active regions (4S, 4D). In this case, the anneal process can be performed at any point in time prior to removal of the disposable gate structure (50, 52, 58), or during evaporation of electrical dopants from physically exposed portions of the at least one semiconductor fin 30 after removal of the disposable gate structure (50, 52, 58), or after formation of a replacement gate structure. Such variations are expressly contemplated herein.

If ex-situ doping is employed, ion implantation of atoms of electrical dopants of the second conductivity type can provide electrical doping to portions of the at least one semiconductor fin 30 that do not underlie the gate structures (50, 52, 58). The implanted portions of the at least one semiconductor fin 30 are converted into fin active regions (3S, 3D). The fin active regions (3S, 3D) can include at least one fin source region 3S and at least one fin drain region 3D. As used herein, an "active region" can be a source region or a drain region of a field effect transistor. As used herein, a "fin active region" refers to an active region located within a semiconductor fin. As used herein, a "fin source region" refers to a source region located within a semiconductor fin. As used herein, a "fin drain region" refers to a drain region located within a semiconductor fin. The at least one semiconductor fin 30 as provided includes electrical dopants of the first conductivity type, and ions of the second conductivity type can be implanted to form the fin active regions (3S, 3D).

The fin active regions (3S, 3D) can be formed by ion implantation concurrently with the ex-situ doping of the raised active regions (4S, 4D), by in-situ doping of raised active regions (4S, 4D) during the selective epitaxy process and outdiffusion of dopants from the raised active regions (4S, 4D) by an anneal, or a combination of ex-situ doping of the raised active regions (4S, 4D), in-situ doping of the raised active regions (4S, 4D) during the selective epitaxy process, and outdiffusion of dopants from the raised active regions (4S, 4D) by an anneal.

After formation of the fin active regions (3S, 3D), each portion of the at least one semiconductor fin 30 having a doping of the first conductivity type constitutes a body region 3B. A p-n junction can be formed at the interfaces between each adjoining pair of a body region 3B and a fin active region (3S or 3D).

Atoms of the electrical dopants of the second conductivity type are present within each fin source region 3S and each fin drain region 3D at an atomic concentration that is greater than the first concentration, which is the atomic concentration of the atoms of electrical dopants of the first conductivity type in the at least one semiconductor fin (3S, 3D, 3B). Thus, the overall doping of the fin active regions (3S, 3D) is the second conductivity type. In one embodiment, each fin active region (3S, 3D) can include a portion having a uniform concentration of the atoms of electrical dopants of the second conductivity type, which is herein referred to as a second concentration.

The second concentration can be in a range from $3.0 \times 10^{19}/cm^3$ to $3.0 \times 10^{21}/cm^3$, although lesser and greater concentrations can also be employed. In one embodiment, the second concentration can be in a range from $3.0 \times 10^{20}/cm^3$ to $1.0 \times 10^{21}/cm^3$. A pair of p-n junctions is formed in each semiconductor fin (3S, 3D, 3B) due to formation of the fin active regions (3S, 3D), which are formed by doping end portions of the semiconductor fin (3S, 3D, 3B) with atoms of the electrical dopant of the second conductivity type.

Referring to FIGS. 5A-5C, a planarization dielectric layer 60 can be formed over the at least one semiconductor fin (3S, 3D, 3B), the raised active regions (4S, 4D), the disposable gate structure (50, 52, 58), and the shallow trench isolation layer 20. The planarization dielectric layer 60 includes a dielectric material that is self-planarizing or can be planarized, for example, by chemical mechanical planarization. The planarization dielectric layer 60 can include a dielectric material such as silicon oxide, silicon nitride, silicon oxynitride, or a combination thereof. In one embodiment, the planarization dielectric layer 60 can be deposited by chemical vapor deposition. The top surface of the contact level dielectric layer 80 can be planar, and can be located at, or above, the horizontal plane including the topmost surface of the disposable gate structure (50, 52, 58). In one embodiment, a topmost portion of the disposable gate structure (50, 52, 58) can be eroded during chemical mechanical planarization, and the topmost surface of the remaining portion of the upper disposable gate material portion 58 can be coplanar with the top surface of the planarization dielectric layer 60. The planarization dielectric layer 60 can be is in physical contact with the top surfaces and sidewalls of the raised active regions (4S, 4D) and the top surface of the shallow trench isolation layer 20.

Figure 6A:
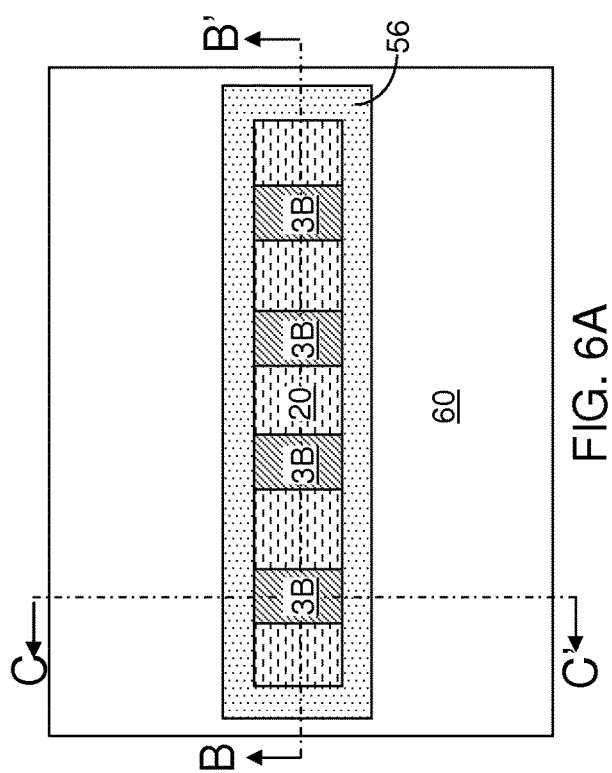
FIG. 6A is a top-down view of the exemplary semiconductor structure after formation of a gate cavity by removal of the disposable gate structure according to an embodiment of the present disclosure.
Figure 6C:
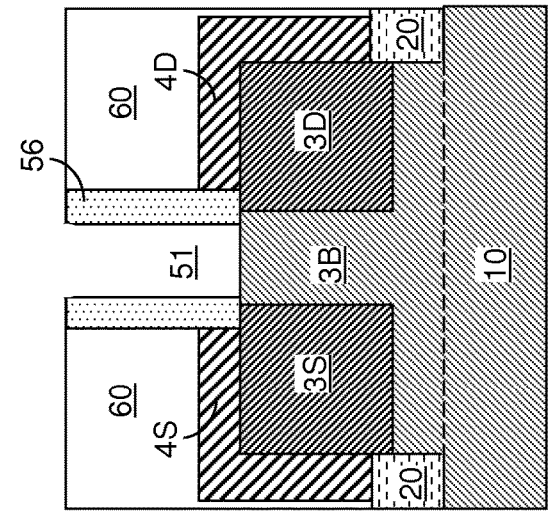
FIG. 6C is a vertical cross-sectional view of the exemplary structure along the vertical plane C-C' in FIG. 6A.
Figure 6B:
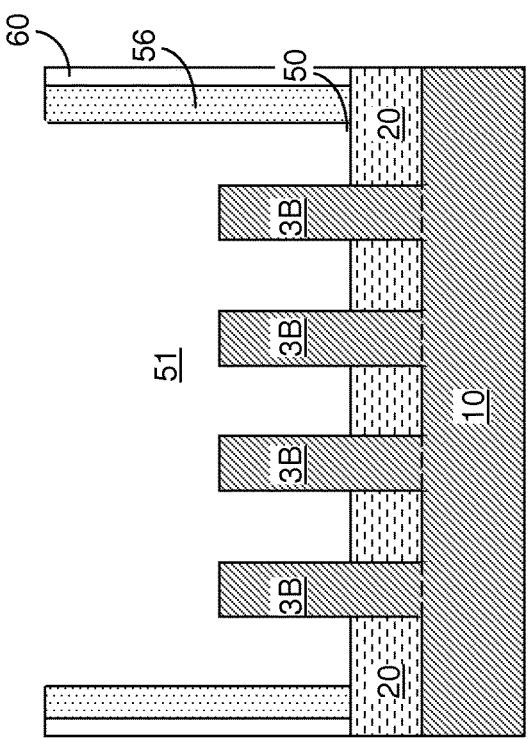
FIG. 6B is a vertical cross-sectional view of the exemplary structure along the vertical plane B-B' in FIG. 6A.

Referring to FIGS. 6A-6C, the disposable gate structure (50, 52, 58) can be removed to form a gate cavity 51. Specifically, the disposable gate structure (50, 52, 58) can be removed selective to the dielectric materials of the planarization dielectric layer 60 and the gate spacer 56 and the semiconductor material of the at least one semiconductor fin (3S, 3D, 3B) to form the gate cavity 51 by employing a combination of etch processes. The etch process can include at least one wet etch process and/or at least one dry etch process that are selected to etch each component of the disposable gate structure. Chemistries known in the art can be employed to remove the disposable gate structure (50, 52, 58). The gate cavity 51 is formed in a volume from which the disposable gate structure (50, 52, 58) is removed. The gate cavity 51 straddles the at least one semiconductor fin (3S, 3D, 3B), and is embedded in the planarization dielectric layer 60.

Figure 7A:
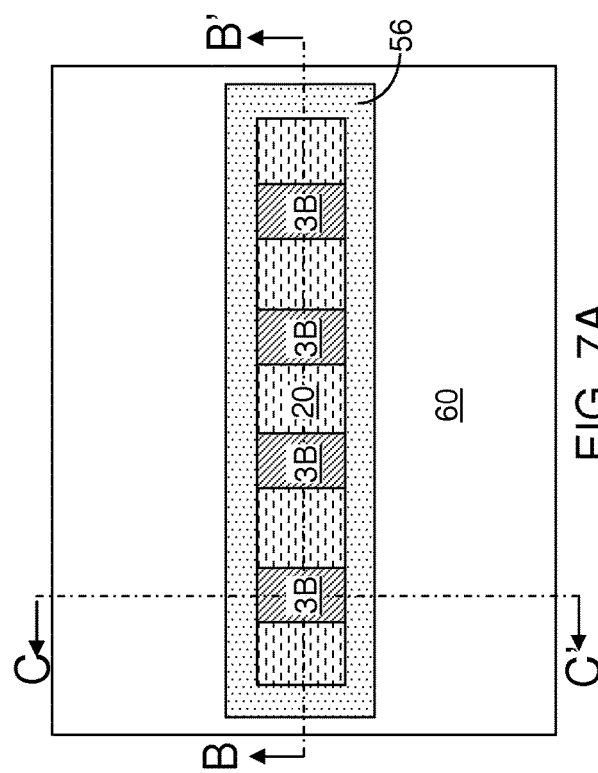
FIG. 7A is a top-down view of the exemplary semiconductor structure after evaporation of dopants from physically exposed portions of the semiconductor fins according to an embodiment of the present disclosure.
Figure 7C:
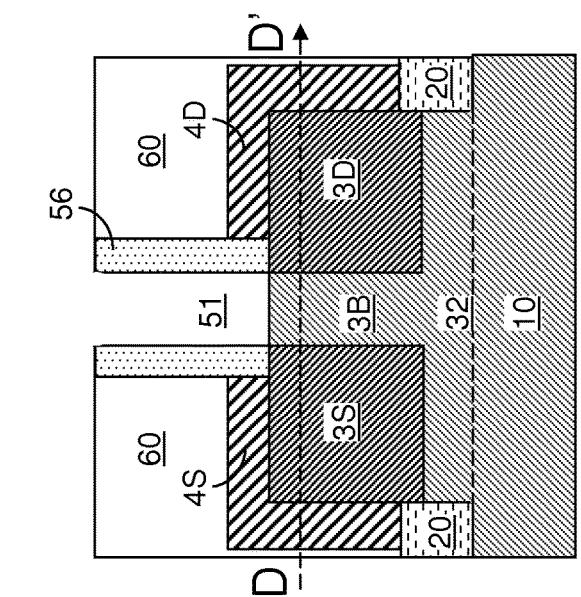
FIG. 7C is a vertical cross-sectional view of the exemplary structure along the vertical plane C-C' in FIG. 7A.
Figure 7B:
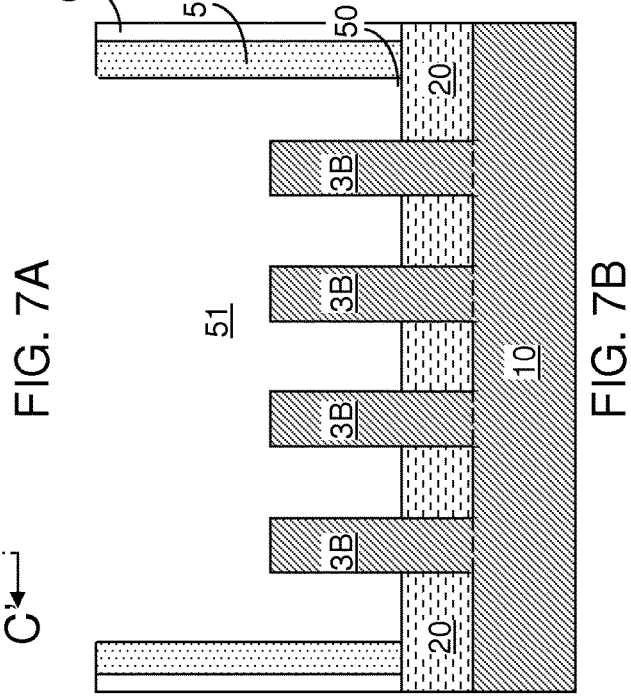
FIG. 7B is a vertical cross-sectional view of the exemplary structure along the vertical plane B-B' in FIG. 7A.

Referring to FIGS. 7A-7C, the exemplary semiconductor structure can be annealed in a non-oxidizing ambient to evaporate atoms of electrical dopants of the first conductivity type from the physically exposed surfaces of the at least one semiconductor fin (3S, 3D, 3B). In one embodiment, all physically exposed surfaces of the at least one semiconductor fin (3S, 3D, 3B) can be surfaces of the at least one body region 3B of the at least one semiconductor fin (3S, 3D, 3B). In one embodiment, the non-oxidizing ambient can be a reducing environment. In one embodiment, the non-oxidizing ambient can include hydrogen gas and optionally at least one inert gas such as nitrogen, helium, argon, and/or neon. In one embodiment, the non-oxidizing ambient can include hydrogen gas and nitrogen gas.

The anneal process is performed at a temperature at which the electrical dopants of the first conductivity type in the at least one body region 3B can be outgassed, i.e., evaporated in a gas form. In one embodiment, the electrical dopants of the first conductivity type in the at least one body region 3B can be outgassed as a hydride gas such as $BH_3$, $PH_3$, $AsH_3$, or $SbH_3$. In one embodiment, the anneal process is performed in at a temperature greater than 700 degrees Celsius. In one embodiment, the anneal process can be performed in a temperature range from 700 degrees Celsius to 1,200 degrees Celsius. A subset of the atoms of the electrical dopant of the first conductivity type is evaporated from the portion of each semiconductor fin (3S, 3D, 3B) that underlies the gate cavity 51 and physically exposed to the ambient during the anneal process.

Figure 8:
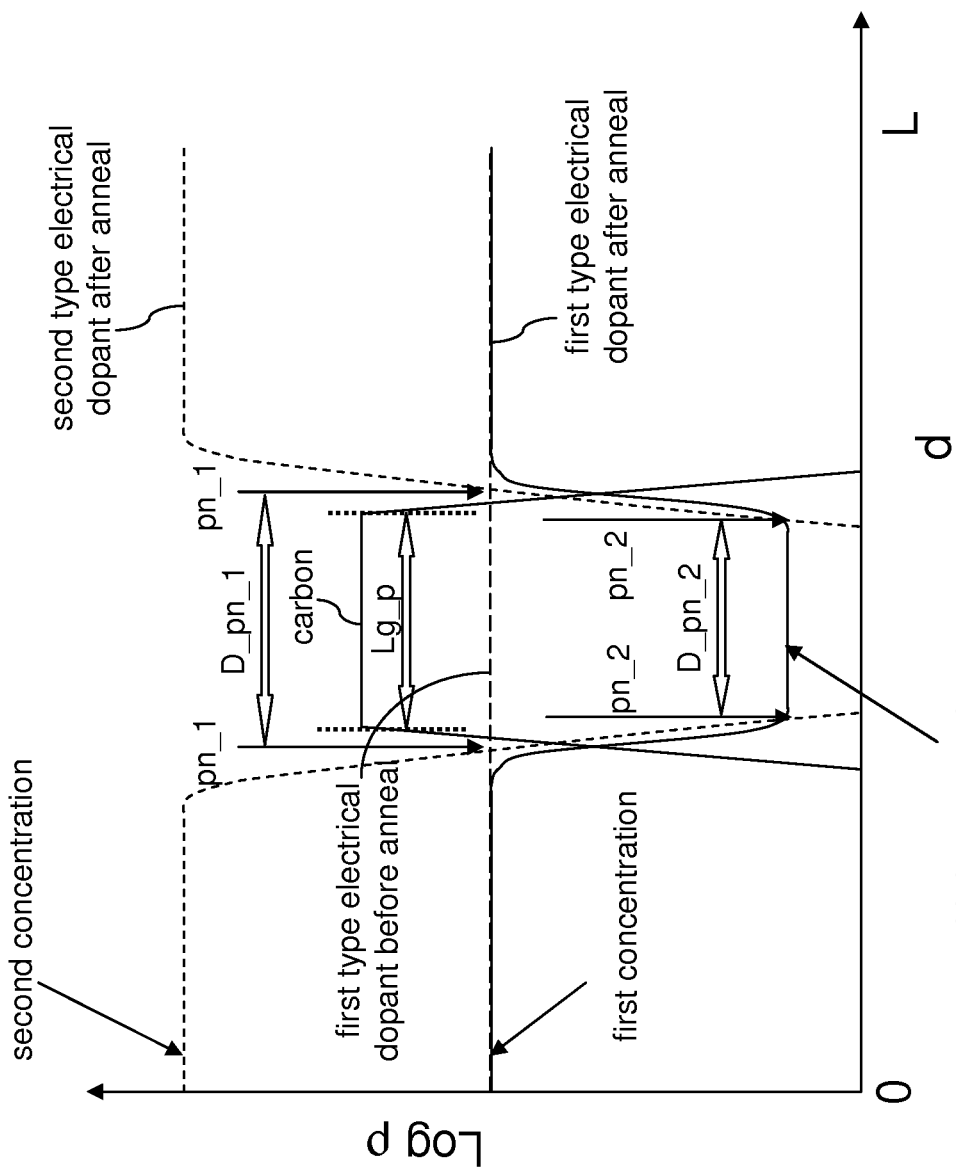
FIG. 8 is a diagram illustrating the dopant concentration of various dopants along the horizontal plane D-D' in FIG. 8C according to an embodiment of the present disclosure.

The distribution of the electrical dopants before and after the anneal process along the lengthwise direction at horizontal plane D-D' in FIG. 7C is schematically illustrated in FIG. 8. The horizontal axis labeled "d" represent the horizontal distance within the horizontal plane D-D' in FIG. 7C from an end wall of a semiconductor fin (3S, 3D, 3B). The vertical axis labeled "Log ρ" represents the logarithm of atomic concentration of electrical dopants of each conductivity type.

Before the anneal process, the concentration of atoms of the electrical dopant of the first conductivity type is the same throughout the entirety of each semiconductor fin (3S, 3D, 3B), and is at the first concentration. The concentration of atoms of the electrical dopant of the first conductivity type before the anneal process is shown by a dashed line labeled "first type electrical dopant before anneal." Before the anneal process, the concentration of atoms of the electrical dopant of the second conductivity type is constant in end portions of the fin active regions (3S, 3D) at a second concentration that is greater than the first concentration. The concentration of atoms of the electrical dopant of the second conductivity type decreases exponentially at a periphery of the portions containing the electrical dopants of the second conductivity type. The concentration of atoms of the electrical dopant of the second conductivity type decreases to a level less than the first level within the body region 3B due to the exponential decay. The p-n junctions formed at distances marked "pn_1" represent the boundary between the body region 3B and the fin active regions (3S, 3D). The first lateral distance between the p-n junctions prior to the anneal process is marked as "D_pn_1."

After the anneal process, the concentration of atoms of the electrical dopant of the first conductivity type is lesser in the portion of each semiconductor fin (3S, 3D, 3B) underlying the gate cavity 51 (i.e., the body region 3B) than in portions of the semiconductor fin (3S, 3D, 3B) that do not underlie the gate cavity 51 (i.e., the source region 3S and the drain region 3D). The decrease in the concentration of atoms of the electrical dopant of the first conductivity type in the body region 3B of the semiconductor fin (3S, 3D, 3B) is due to the evaporation of the dopants of the first conductivity type during the anneal process. The concentration of atoms of the electrical dopant of the first conductivity type after the anneal process is shown by a solid line labeled "first type electrical dopant after anneal." The body region 3B can include a portion in which the concentration of atoms of electrical dopants of the first conductivity type is uniform at a third concentration, which is less than the first concentration. The third concentration can be in a range from 0.0001% to 90% of the first concentration. In one embodiment, the third concentration can be less than 50% of the first concentration. In another embodiment, the third concentration can be less than 10% of the first concentration. In yet another embodiment, the third concentration can be less than 1% of the first concentration. The fin active regions (3S, 3D) include portions containing electrical dopants of the first conductivity type at the first concentration.

It is noted that the concentration of atoms of the electrical dopant of the first conductivity type after the anneal process is the same as the concentration of atoms of the electrical dopant of the first conductivity type before the anneal process in portions of the fin source region 3S and the fin drain region 3D at which the concentration of atoms of the electrical dopant of the first conductivity type does not change. After the anneal process, the concentration of atoms of the electrical dopant of the second conductivity type can be constant in end portions of the fin active regions (3S, 3D) at the second concentration.

Because the anneal induces reduction of the concentration of the electrical dopants of the first conductivity type in the body region 3B, the p-n junctions shift to new positions marked "pn_2." The lateral distance between the p-n junctions decreases due to the loss of the electrical dopants of the first conductivity type in the body region 3B, and as a result, the size of the body region (defined as the region bounded by the p-n junctions) decreases. The second lateral distance between the p-n junctions after to the anneal process is marked as "D_pn_2." The second lateral distance D_pn_2 is less than the first lateral distance D_pn_1.

The evaporation of the electrical dopants of the first conductivity type by outgassing during the anneal has the effect of decreasing the doping of the body region 3B, and consequently, the threshold voltage of the field effect transistor shifts due to the anneal process.

Optionally, carbon atoms can be implanted into the body region 3B of each semiconductor fin (3S, 3D, 3B) by ion implantation or plasma doping. The carbon atoms are implanted only into the portion of each semiconductor fin (3S, 3D, 3B) underlying the gate cavity 51 while the gate cavity 51 is present. The implantation of the carbon atoms has the effect of deactivating the electrical dopants in the body region 3B. Because the electrical dopants of the first conductivity type that are present in the body region 3B of each semiconductor fin (3S, 3D, 3B) are deactivated by the implanted carbon atoms, and the net effect of implantation of the carbon atoms is reduction of active electrical dopants in the body region 3B, and consequent shift in the threshold voltage of the field effect transistor.

The concentration profile of the implanted carbon atoms has a plateau in the portion of the semiconductor fin (3S, 3D, 3B) that coincides with the physical width of the gate cavity 51. The physical width of the gate cavity 51 is herein referred to as a physical gate length Lg_p. The uniformly doped portion of the body region 3B can include carbon atoms at a uniform concentration. The concentration of the implanted carbon atoms at the plateau, i.e., the uniformly doped portion, can be in a range from $1.0\times10^{14}/cm^3$ to $1.0\times10^{19}/cm^3$, although lesser and greater carbon concentrations can also be employed. The concentration of the implanted carbon decays exponentially in regions that do not directly underlie the gate cavity 51.

The anneal process and the carbon implantation process can be performed in series, or only one of the anneal process and the carbon implantation process may be performed.

Figure 9A:
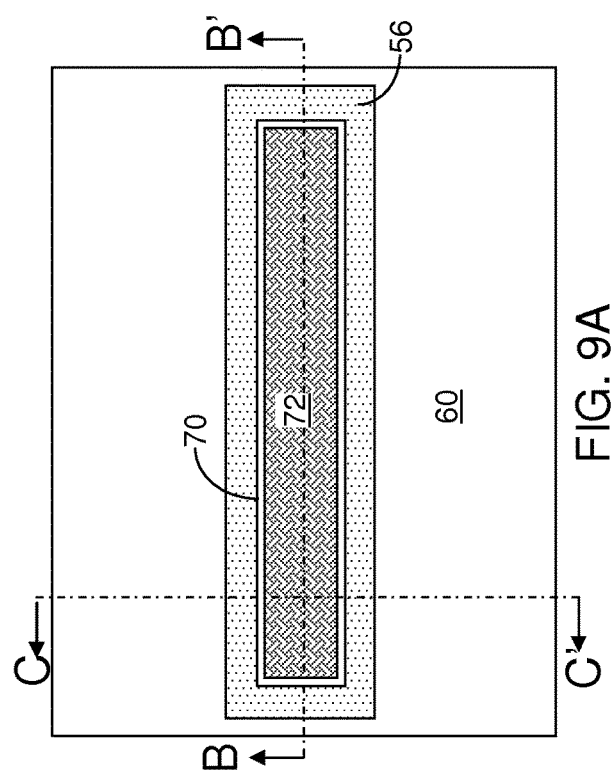
FIG. 9A is a top-down view of the exemplary semiconductor structure after formation of a replacement gate structure according to an embodiment of the present disclosure.
Figure 9C:
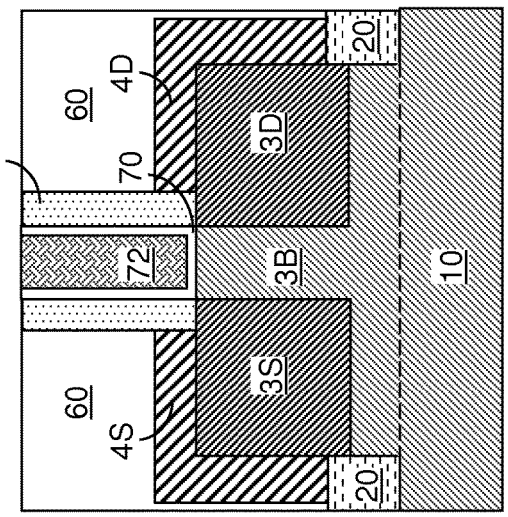
FIG. 9C is a vertical cross-sectional view of the exemplary structure along the vertical plane B-B' in FIG. 9A.
Figure 9B:
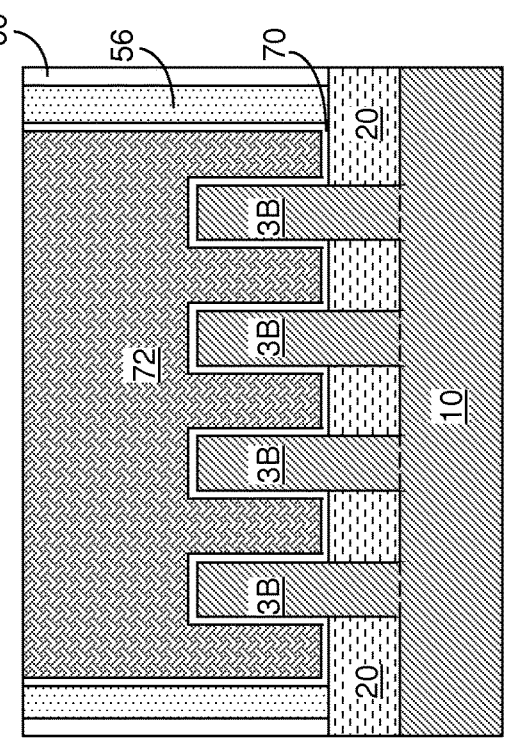
FIG. 9B is a vertical cross-sectional view of the exemplary structure along the vertical plane B-B' in FIG. 9A.

Referring to FIGS. 9A-9C, a replacement gate structure (70, 72) can be formed within the gate cavity 51. For example, a gate dielectric 70 and a gate electrode 72 can be formed within the gate cavity 51 by deposition of a dielectric material and at least one conductive material, and removal of excess portions of the dielectric material and the at least one conductive material from above the top surface of the planarization dielectric layer 60. The gate dielectric 70 can include a high dielectric constant (high-k) dielectric material known in the art. The gate electrode 72 can include a doped semiconductor material and/or a metallic material. The top surfaces of the gate structure (70, 72) can be coplanar with the top surface of the planarization dielectric layer 60.

The exemplary semiconductor structure includes at least a semiconductor fin (3S, 3D, 3B) located on a substrate 10 and including a source region (such as a fin source region 3S), a drain region (such as a fin drain region 3D), and a body region 3B. Each of the source region and the drain region includes a uniformly doped portion including atoms of a first electrical dopant of a first conductivity type at a first concentration and a second electrical dopant of a second conductivity type at a second concentration that is greater than the first concentration. The second conductivity type is the opposite of the first conductivity type. The body region 3B includes another uniformly doped portion containing atoms of the first electrical dopant at a third concentration that is less than the first concentration. The exemplary semiconductor structure further includes a gate stack (70, 72) including a gate dielectric 70 and a gate electrode 72 and straddling the body region 3B.

In one embodiment, the uniformly doped portion in the body region 3B can be essentially free of atoms of the second electrical dopant. As used herein, a region is "essentially free of atoms of" an atomic element if the atomic element is not present in the region or is present in a region at a trace level, e.g., less than 10 part per billion.

In one embodiment, the exemplary semiconductor structure can further include a raised source region 4S and a raised drain region 4D, each of which includes a semiconductor material epitaxially aligned to the source region and the drain region, respectively, and including atoms of the second electrical dopant at a concentration that is not less than the second concentration.

In one embodiment, the lateral distance between a first p-n junction between the body region 3B and the source region and a second p-n junction between the body region 3B and the drain region can be less than a width of the interface between the gate dielectric 70 and the semiconductor fin (3S, 3D, 3B).

In one embodiment, the gate dielectric 70 can be a U-shaped gate dielectric including a horizontal portion in contact with a top surface of the body region 3B, vertical portions in contact with sidewalls of the body region 3B, and additional vertical portions that extend upward from the horizontal portion of the U-shaped gate dielectric.

Figure 10A:
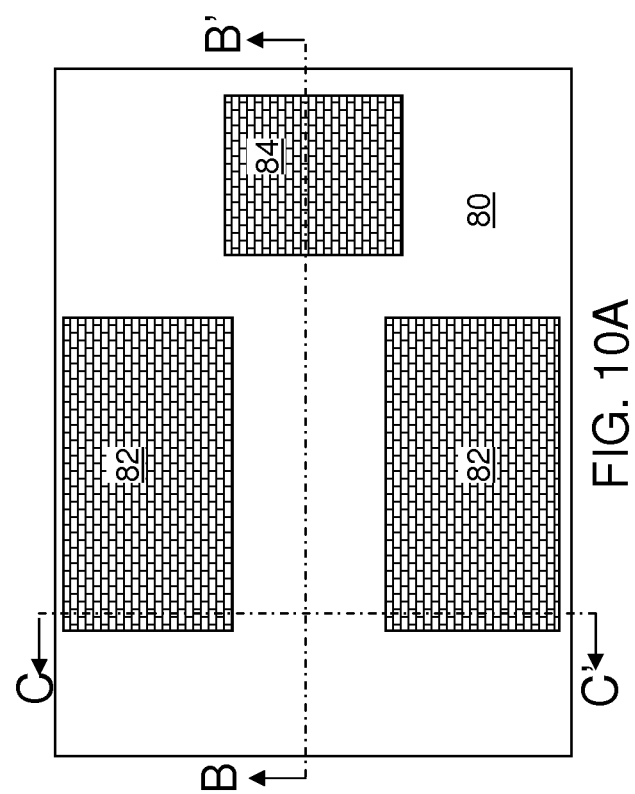
FIG. 10A is a top-down view of the exemplary semiconductor structure after formation of a contact level dielectric layer and various contact via structures according to an embodiment of the present disclosure.
Figure 10C:
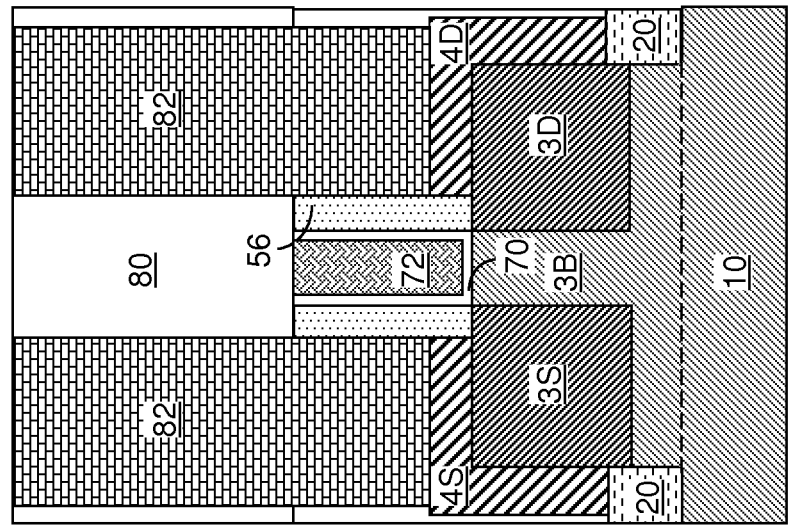
FIG. 10C is a vertical cross-sectional view of the exemplary structure along the vertical plane C-C' in FIG. 10A.
Figure 10B:
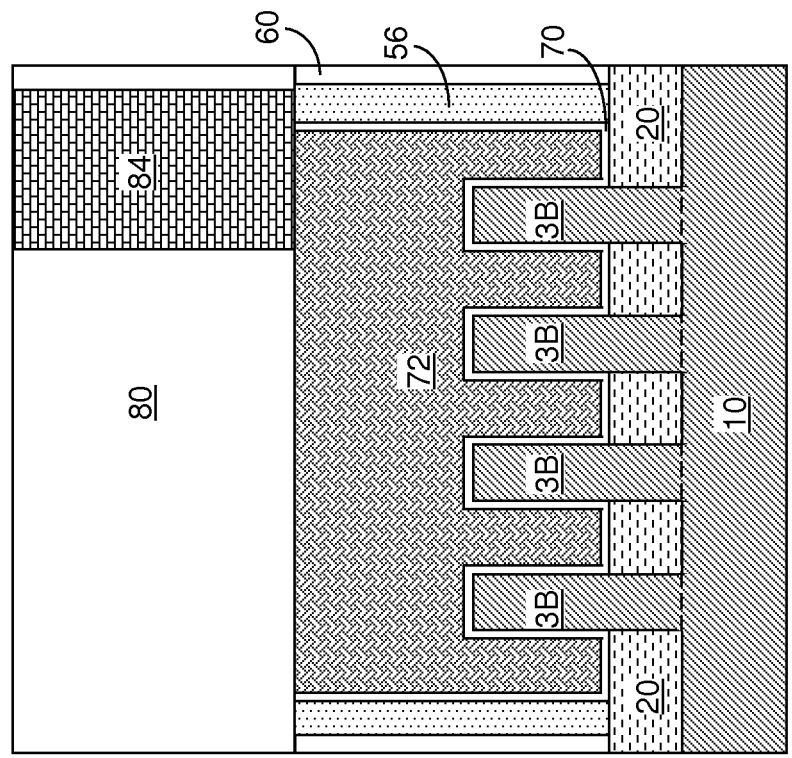
FIG. 10B is a vertical cross-sectional view of the exemplary structure along the vertical plane B-B' in FIG. 10A.

Referring to FIGS. 10A-10C, a contact level dielectric layer 80 is deposited over the top surface of the gate structure (70, 72) and the planarization dielectric layer 60. The contact level dielectric layer 80 includes a dielectric material that is deposited by chemical vapor deposition or spin coating. The contact level dielectric layer 80 can include a dielectric material such as silicon oxide, silicon nitride, silicon oxynitride, porous or non-porous organosilicate glass (OSG), or a combination thereof. In one embodiment, the top surface of the contact level dielectric layer 80 can be horizontal, and the thickness of the contact level dielectric layer 80 can be uniform throughout the entirety thereof. The thickness of the contact level dielectric layer 80 can be in a range from 50 nm to 500 nm, although lesser and greater thicknesses can also be employed.

Various contact via structures (82, 84) can be formed through the contact level dielectric layer 80 and optionally through the planarization dielectric layer 60. The various contact via structures can include active region contact via structures 82 that are electrically shorted to the at least one fin source region 3S or to the at least one fin drain region 3D, and a gate contact via structure 84 that is electrically shorted to the gate electrode 72.

The various dopant profiles of the present disclosure can be employed to reduce active electrical dopants in the body region of a field effect transistor, and to control the threshold voltage of the field effect transistor.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor fin located on a substrate and including a source region, a drain region, and a body region, each of said source region and said drain region comprising a uniformly doped portion of the semiconductor fin, wherein an entirety of each of the source region and drain region comprises atoms of a first electrical dopant of a first conductivity type at a first concentration and atoms of a second electrical dopant of a second conductivity type at a second concentration that is greater than said first concentration, said second conductivity type being the opposite of said first conductivity type, and said body region including another uniformly doped portion of the semiconductor fin containing atoms of said first electrical dopant at a third concentration that is less than said first concentration, and wherein the source region directly contacts one side of the body region, and drain region directly contacts another side of the body region; and
   a gate stack including a gate dielectric and a gate electrode and straddling said body region, wherein each of said source region and said drain region has a topmost surface, a bottommost surface, a first vertical sidewall defined by an end sidewall of said semiconductor fin and extending from said topmost surface to said bottommost surface, and a second vertical sidewall that directly contacts an entirety of a vertical sidewall of said body region and extending from said topmost surface to said bottommost surface, wherein said second vertical sidewall is vertically aligned to an outermost sidewall of the gate stack.

2. The semiconductor structure of claim 1, wherein said body region is essentially free of atoms of said second electrical dopant.

3. The semiconductor structure of claim 1, further comprising a raised source region and a raised drain region that include a semiconductor material epitaxially aligned to said source region and said drain region, respectively, and including atoms of said second electrical dopant at a concentration that is not less than said second concentration.

4. The semiconductor structure of claim 1, wherein a lateral distance between a first p-n junction between said body region and said source region and a second p-n junction between said body region and said drain region is less than a width of an interface between said gate dielectric and said semiconductor fin.

5. The semiconductor structure of claim 1, wherein said another uniformly doped portion of the semiconductor fin that constitutes said body region includes carbon atoms at a uniform concentration.

6. The semiconductor structure of claim 1, wherein said gate dielectric is a U-shaped gate dielectric including a horizontal portion in contact with a top surface of said body region, vertical portions in contact with sidewalls of said body region, and additional vertical portions that extend upward from said horizontal portion of said U-shaped gate dielectric.

7. The semiconductor structure of claim 1, further comprising a gate spacer located on vertical sidewalls of said gate stack.

8. The semiconductor structure of claim 1, further comprising a planarization dielectric layer surrounding said gate stack, said planarization dielectric layer having a topmost surface that is coplanar with a topmost surface of said gate stack.

9. The semiconductor structure of claim 1, wherein said first conductivity type is n-type and said second conductivity type is p-type.

10. The semiconductor structure of claim 1, wherein said first conductivity type is p-type and said second conductivity type is n-type.

11. The semiconductor structure of claim 1, wherein said substrate is an insulator layer.

12. The semiconductor structure of claim 1, further comprising a shallow trench isolation layer formed around a bottom portion of the semiconductor fin.

13. The semiconductor structure of claim 12, wherein said shallow trench isolation layer has a bottommost surface directly contacting a topmost surface of said substrate and a topmost surface that is located beneath a topmost surface of said semiconductor fin.

14. The semiconductor structure of claim 1, wherein said body region includes C.

15. The semiconductor structure of claim 14, wherein said C is present in said body region in a concentration from $1.0 \times 10^{14}/cm^3$ to $1.0 \times 10^{19}/cm^3$.

16. The semiconductor structure of claim 1, wherein said substrate is a semiconductor material.

17. The semiconductor structure of claim 16, wherein said substrate and said semiconductor fin constitute a contiguous semiconductor material portion.

18. The semiconductor structure of claim 1, wherein said first concentration is from $1.0 \times 10^{15}/cm^3$ to $1.0 \times 10^{19}/cm^3$, said second concentration is from $3.0 \times 10^{19}/cm^3$ to $3.0 \times 10^{21}/cm^3$, and said third concentration is a range from 0.0001% to 90% of said first concentration.

19. The semiconductor structure of claim 18, wherein said third concentration is less than 50% of said first concentration.

20. The semiconductor structure of claim 18, wherein said third concentration is less than 1% of said first concentration.

* * * * *